United States Patent
Mori

[19]

[11] Patent Number: 6,142,808
[45] Date of Patent: Nov. 7, 2000

[54] SOCKET FOR ELECTRICAL PARTS

[75] Inventor: Kentaro Mori, Kawaguchi, Japan

[73] Assignee: Enplas Corporation, Saitama-ken, Japan

[21] Appl. No.: 09/071,631

[22] Filed: May 1, 1998

[30] Foreign Application Priority Data

May 8, 1997 [JP] Japan .................................. 9-134412

[51] Int. Cl.[7] .................................................. H01R 11/22
[52] U.S. Cl. ........................... 439/266; 439/266; 439/267; 439/330
[58] Field of Search ............................. 439/266, 267, 439/330

[56] References Cited

U.S. PATENT DOCUMENTS

| | | | |
|---|---|---|---|
| 5,028,985 | 7/1991 | Matsuoka | 375/74 |
| 5,320,551 | 6/1994 | Mori et al. | 439/266 |
| 5,334,036 | 8/1994 | Matsuoka | 439/266 |
| 5,443,396 | 8/1995 | Tokushige | 439/266 |
| 5,447,444 | 9/1995 | Matsuoka | 439/266 |
| 5,628,645 | 5/1997 | Matsuoka | 439/331 |
| 5,683,262 | 11/1997 | Matsuoka | 439/266 |
| 5,700,155 | 12/1997 | Matsuoka | 439/266 |
| 5,713,751 | 2/1998 | Fukunaga | 439/266 |

FOREIGN PATENT DOCUMENTS

| | | | |
|---|---|---|---|
| 5-114661 | 5/1993 | Japan . | |
| 2091036 | 7/1982 | United Kingdom | 23/32 |

Primary Examiner—Paula Bradley
Assistant Examiner—Truc Nguyen
Attorney, Agent, or Firm—Fish & Richardson P.C.

[57] ABSTRACT

A socket for an electrical part comprises a socket body provided with a mount portion on which an electrical part such as IC package is mounted, a plurality of contact pins mounted to the socket body to be separated from and contacted to terminals such as IC leads of the electrical part and an upper operation member disposed to the socket body to be vertically movable. The contact pins each comprises a stationary contact piece to be contacted to a lower surface of the terminal and a movable contact piece to be contacted to an upper surface of the terminal so as to clamp the terminal therebetween in a manner that when the upper operation member is moved vertically, the movable contact piece is deformed to be separated from and contacted to the terminal. The stationary contact piece has an upper surface higher, in a level in a mounted state, than an upper surface of the mount portion of the socket body and the socket body is formed with a plurality of projections at portions near the stationary contact pieces so that a gap is formed between each of the projections and each of the stationary contact pieces so as to have a width smaller than a width of the terminal to prevent the terminal from falling out therethrough.

6 Claims, 7 Drawing Sheets

SOCKET FOR ELECTRICAL PARTS

BACKGROUND OF THE INVENTION

The present invention relates to a socket for an electrical part for detachably holding an electrical part such as semiconductor device (called ìIC packageî hereinlater).

Figure 9:
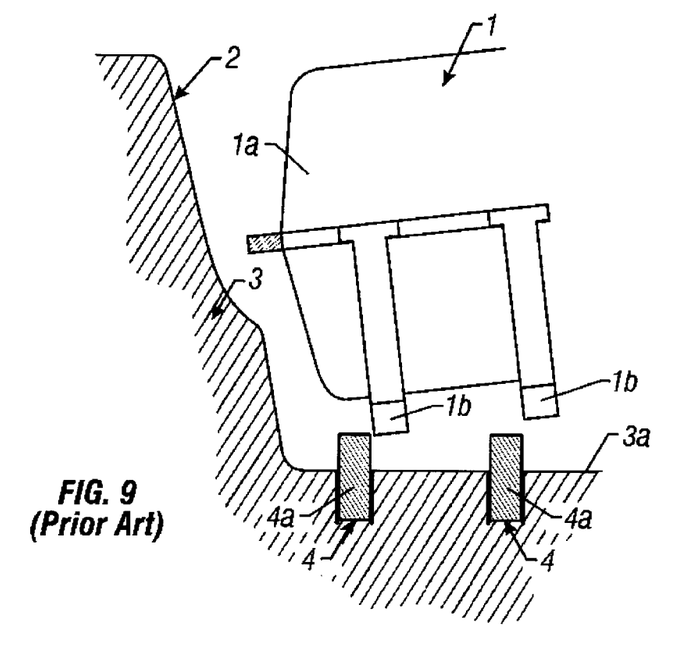
FIG. 9 is a sectional view showing a conventional structure corresponding that of FIG. 1A.
Figure 10:
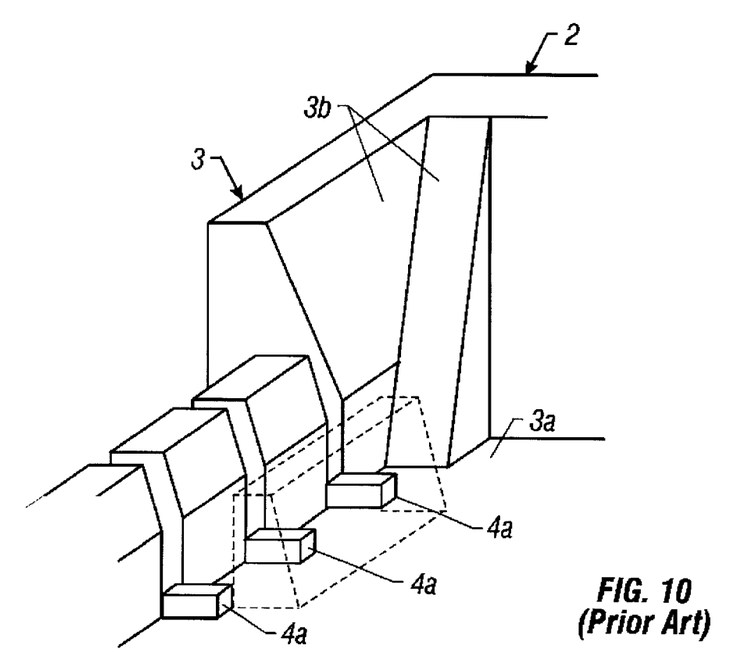
FIG. 10 is a perspective view showing the conventional structure corresponding to that of FIG. 6.

A socket for an electrical part of the kind mentioned above having a conventional structure is shown in FIGS. 9 and 10, in which an IC package 1 as the electrical part is detachably held by an IC socket 2.

The IC package 1 is so-called a gull-wing type one having a rectangular or square package body 1*a* and a plurality of IC leads 1*b* as terminals projecting sideway from the package body 1*a*.

The IC socket 2 is composed of a socket body 3, a mount portion 3*a* on which the IC package 1 is rested and a guide portions 3*b*, disposed so as to correspond to respective corner portions of the rectangular IC package 1 when rested, for positioning the rectangular IC package 1 to a predetermined position.

Further, a plurality of contact pins 4, which are elastically deformable and contacted to or separated from the IC leads 1*b* of the IC package 1, are arranged to the socket body 3. Each of the contact pins 4 is composed of a stationary contact piece 4*a* and a movable contact piece, not shown, disposed on the upper portion of the stationary contact piece 4*a*, and the IC lead 1*b* of the IC package 1 is interposed and clamped between the stationary contact piece 4*a* and the movable contact piece.

Furthermore, there is also provided an upper operation member, not shown, for the socket body 3 to be vertically movable. When the upper operation member is lowered against the urging force of a spring, the movable contact piece of the contact pin 4 is elastically deformed and hence separated from the IC lead 1*b* and, on the other hand, when the upper operation member is raised upward, the movable contact piece returns by the elasticity and depresses the IC lead 1*b* from the upper side thereof to clamp it between the movable and stationary contact pieces.

The stationary contact pieces 4*a* are projected upward by a predetermined amount from the mount portion 3*a* so as to prevent dust or dirt from adhering to the stationary contact pieces 4*a* and staying between them and the IC leads 1*b*.

In the conventional structure mentioned above, a countermeasure against the adhering or staying of the dust or dirt by locating the stationary contact pieces 4*a* so as to project, by a predetermined distance, upward from the upper surface of the mount portion 3*a*. However, when the IC package 1 is mounted to the predetermined position, there may cause a case where the IC package 1 is somewhat inclined at the initial stage of mounting. In such a case, there is a fear such that, as shown in FIG. 9, the stationary contact pieces 4*a* and the IC leads 1*b* are shifted in their positions and the IC leads 1*b* are dropped down from the stationary contact pieces 4*a*, and under such state, when the position or attitude of the IC package 1 is corrected with its horizontal state maintained, the IC leads 1*b* may be deformed, resulting in a defective contacting condition to the stationary contact pieces 4*a*.

SUMMARY OF THE INVENTION

A primary object of the present invention is to substantially eliminate defects or drawbacks encountered in the prior art mentioned above and to provide a socket for an electrical part capable of preventing terminals as IC leads from falling out from stationary contact pieces, with dust (dirt) adhering prevention performance being maintained, when the electrical part is mounted to the socket.

Another object of the present invention is to provide a socket for an electrical part capable of smoothly moving the terminals to predetermined positions of the stationary contact pieces to perform positional correction at a time when the terminals are shifted from the upper surfaces of the stationary contact pieces.

A further object of the present invention, in addition to the above objects, is to provide a socket for an electrical part having a compact structure and capable of being manufactured with reduced cost.

These and other objects can be achieved according to the present invention by providing a socket for an electrical part comprising:

a socket body provided with a mount portion on which an electrical part is mounted;

a plurality of contact pins mounted to the socket body to be separated from and contacted to terminals of the electrical part, respectively; and an upper operation member disposed to the socket body to be vertically movable, the contact pins each comprising a stationary contact piece to be contacted to a lower surface of the terminal and a movable contact piece to be contacted to an upper surface of the terminal so as to clamp the terminal therebetween in a manner that when said upper operation member is moved vertically, the movable contact piece is deformed to be separated from and contacted to the terminal, wherein the stationary contact piece has an upper surface higher, in a level in a mounted state, than an upper surface of the mount portion of the socket body and wherein the socket body is formed with a plurality of projections at portions near the stationary contact pieces so that a gap is formed between each of the projections and each of the stationary contact pieces so as to have a width smaller than a width of the terminal to prevent the terminal from falling out therethrough.

In a preferred embodiments, the projection has an upper surface substantially equal in level to an upper surface of the stationary contact piece.

The socket body is provided with guide portions corresponding, in locations thereof, to corner portions of the electrical part respectively and the projections are disposed near each of the guide portions. The socket body is further provided with mold guide portions disposed near the guide portions and adapted to position of the electrical part.

The projections may be disposed between the adjacent stationary contact pieces, and each of the projections has a rectangular cross section.

The electrical part is an IC package and the terminal is an IC lead.

According to the structures and characters of the socket for an electrical part of the present invention mentioned above, since the stationary contact piece has an upper surface higher, in a level in a mounted state, than an upper surface of the mount portion of the socket body by a predetermined amount, the adhesion of dust or dirt to the terminals can be effectively prevented, and the terminal can be also prevented from falling out from the stationary contact piece at the mounting time of the electrical part to the socket body, thus preventing the terminal from being deformed and from causing a defective conduction thereof.

Furthermore, since the projection has an upper surface substantially equal in level to an upper surface of the stationary contact piece, the positional correction can be effectively and smoothly performed during the movement from the shifted position of the terminal to the correct upper surface of the stationary contact piece.

Still furthermore, the falling out of the terminal of the electrical part from the stationary contact piece can be effectively prevented by forming the projections at least the portions near the guide portions of the socket body without forming the projections between all the stationary contact pieces.

The nature and further characteristic features of the present invention will be made more clear from the following descriptions made with reference to the accompanying drawings.

BRIEF DESCRIPTION OF THE DRAWINGS

In the accompanying drawings:

FIGS. 1A and 2A include partial sectional views of an essential portion of one embodiment of the present invention, in which

FIGS. 7A and 7B show a state of an IC package according to the present invention, in which

DESCRIPTION OF THE PREFERRED EMBODIMENT

A preferred embodiment of the present invention will be described hereunder with reference to FIGS. 1 to 8.

With reference to these figures, an IC socket as ìsocket for an electrical partî according to the present invention is denoted by reference numeral 11, and the IC socket 11 is adapted to electrically connect an IC lead 12b as a terminal of an IC package 12 as ìelectrical partî to a printed wiring board, not shown, of a measuring device such as tester for carrying out a performance test of the IC package 12.

Figure 4:
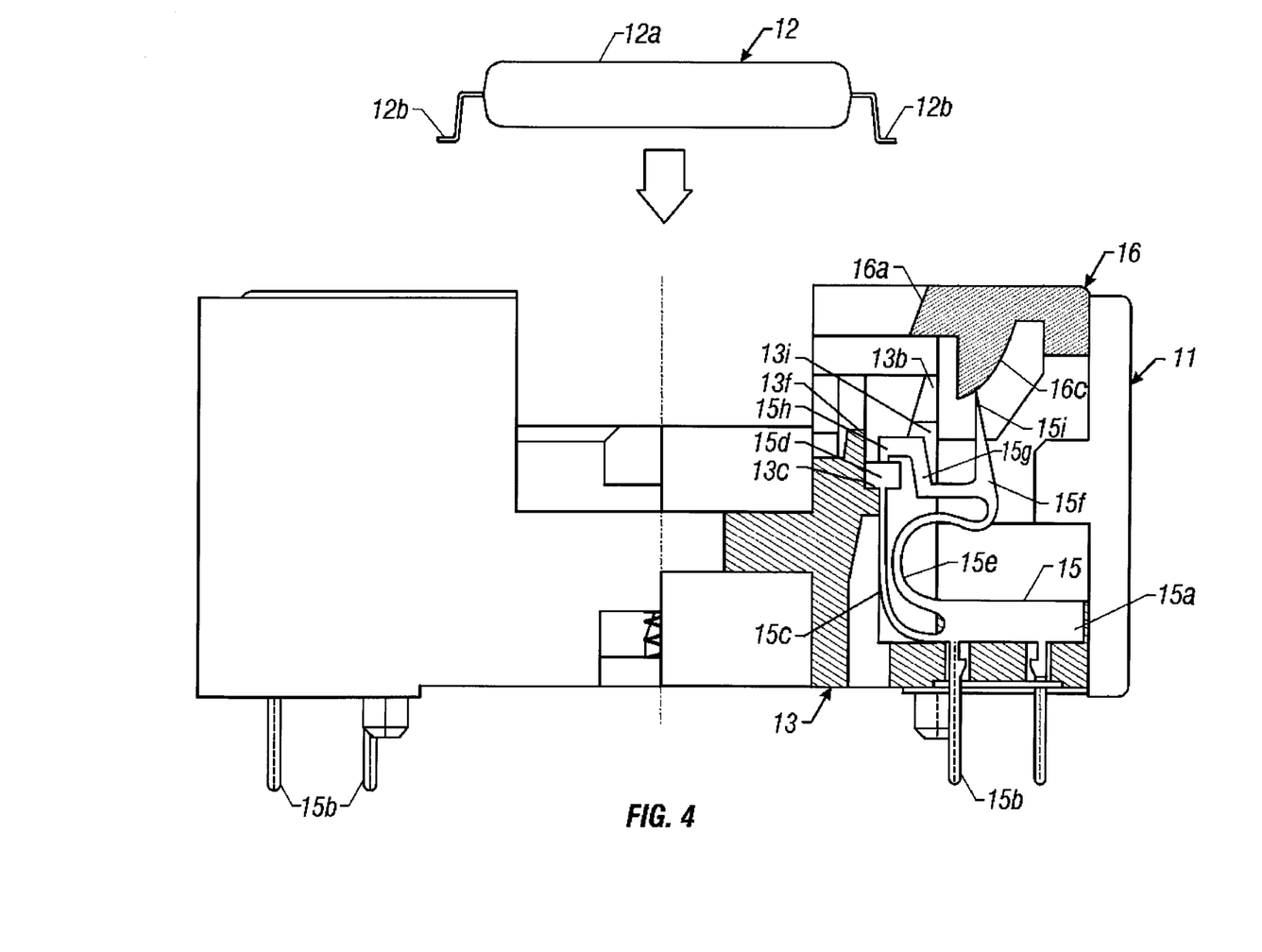
FIG. 4 is a sectional view taken along the line IV—IV of FIG. 2 showing a state that an upper operation member takes its uppermost position.

The IC package 12 is one so-called as gull-wing type as shown in FIG. 4, which is provided with a rectangular package body 12a having two opposing sides from which a plurality of IC leads 12b project sideway.

The IC socket 11 generally comprises a socket body 13 to be mounted to the printed wiring board, the socket body 13 having a mount portion 13a on which the IC package 12 is mounted and guide portions 13b, disposed to positions corresponding to respective corner portions of the package body 12a, for positioning the IC package 12 to a predetermined portion. A plurality of elastically deformable contact pins 15 are disposed to the socket body 13 to be separated from or contacted to the IC leads 12b, respectively, and an upper operation member 16 having a rectangular frame-shape structure is disposed to be vertically movable so as to elastically deform the contact pins 15.

Figure 5:
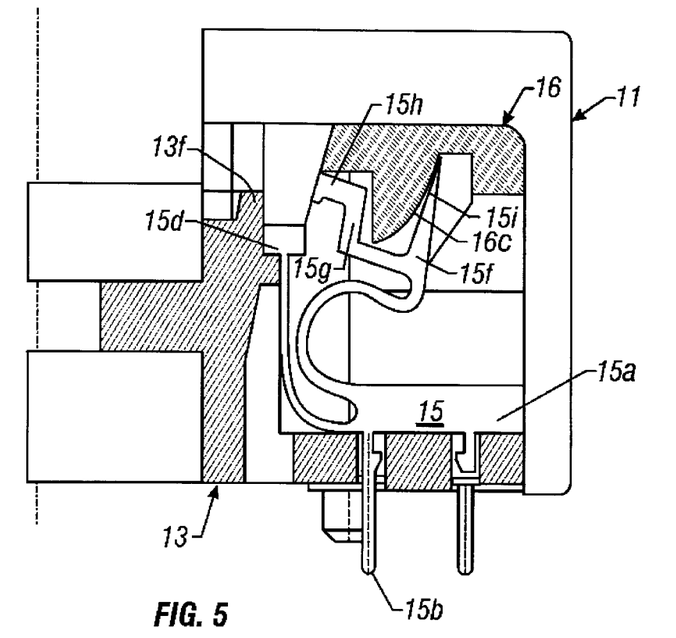
FIG. 5 is a sectional view showing a state that the upper operation member takes its lowermost position.

Each of the contact pins 15 has a springy property as shown in FIGS. 4 and 5 and is formed of a material having a good conductivity. The contact pins 15 having such properties are disposed through press-fitting to outside portions of the mount portion 13a of the socket body 13. In more detail, the contact pin 15 has a base portion 15a from which a lead portion 15 extends downward, and the lead portion 15b is press fitted into the socket body 13 so that a part of the lead portion 15b projecting downward from the socket body 13 is electrically connected to the printed wiring board. A fixing piece 15c is disposed above the base portion 15a so as to project upward and the fixing piece 15c has an upper and portion to which a stationary contact piece 15d is formed so as to extend in a horizontal direction. A movable piece 15f is formed to the outer side of the fixing piece 15c through a spring portion 15e having a curved shape, and an arm piece 15g is formed to the movable piece 15f so as to extend obliquely inward, the arm piece 15g having an upper end to which a movable contact piece 15h is formed so as to extend inward in the horizontal direction. The IC lead 12b of the IC package 12 is clamped by the movable and stationary contact pieces 15h and 15d of the structures mentioned above, and an operation piece 15i is formed to the movable piece 15f so as to project upward.

In one preferred modification, the base portion 15a is sectioned into two parts in a manner that the fixing piece 15c formed with the stationary contact piece 15d is formed to one of the base parts in a projecting manner and, on the other hand, the spring portion 15e formed with the movable contact piece 15h and the arm piece 15g of the movable piece 15f are also formed in a projecting manner to the other one of the base parts, and the lead portions 15b are formed to both the base parts so as to project downward, thus establishing the kelvine connection to the IC leads 12b.

Figure 6:
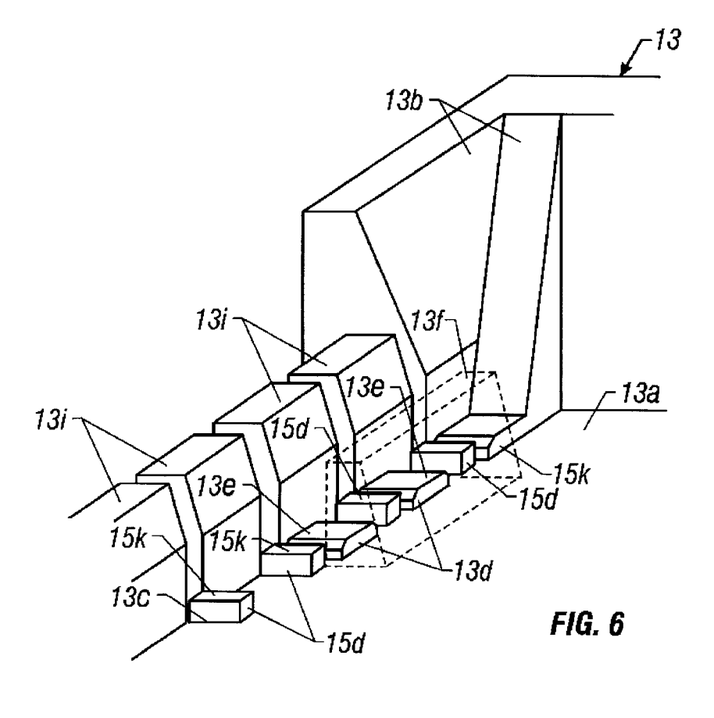
FIG. 6 is a perspective view showing a socket body, stationary contact pieces and associated elements thereof of this embodiment.

The socket body 13 is formed with a plurality of sectioning portions 13i, as shown in FIGS. 4 and 6, at portions outside the mount portion 13a in a manner such that the stationary and movable contact pieces 15d and 15h of the contact pins 15 face the mount portion 13a side through gaps between these sectioning portions 13i.

Figure 1A:
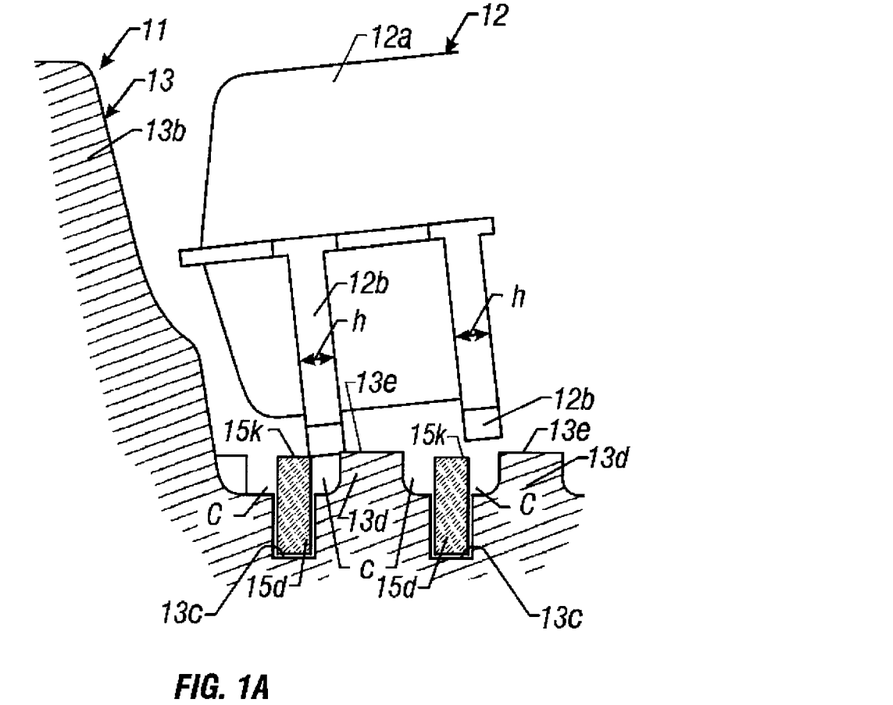
FIG. 1A is a sectional view, enlarged view of a portion A in FIG. 7 mentioned hereinlater, showing a state that stationary contact pieces and IC leads are shifted in positions
Figure 1B:
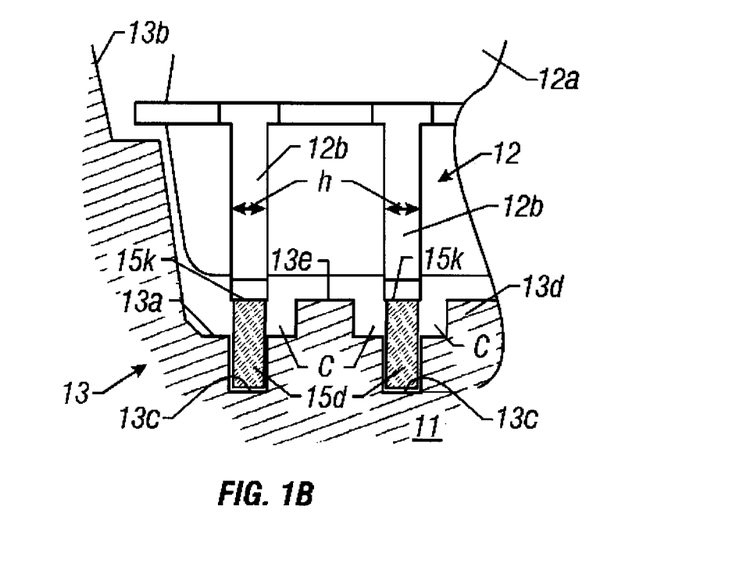
FIG. 1B is also an enlarged sectional view showing a state that the stationary contact pieces and the IC leads are returned to their correct predetermined positions.

In more detail, the stationary contact pieces 15d are fixedly fitted into groove portions 13c formed to the socket body 13, and an upper surface 15k of each of the stationary contact pieces 15d is positioned above the upper surface of the mount portion 13a by an amount of, for example, 0.3 mm. A plurality of projections 13d, each having a rectangular section, are formed to the socket body 13 at portions between the stationary contact pieces 15d near the guide portions 13b so as to project upward. As shown in FIGS. 1A and 1B, a gap c is defined between the projection 13d and the stationary contact piece 15d adjacent to the projection 13d, the gap c having a size smaller than the width h of the IC lead 12b to prevent the IC lead 12b from falling out. The upper surface 15k of the stationary contact piece 15d and the upper surface 13e of the projection 13d are positioned at substantially the same level in height. Further, the movable contact pieces 15h are set so as to be movable between the respective sectioning portions 13i, and mold guides 13f and 13g for positioning the IC package 12 are formed near the respective guide portions 13b.

Figure 2:
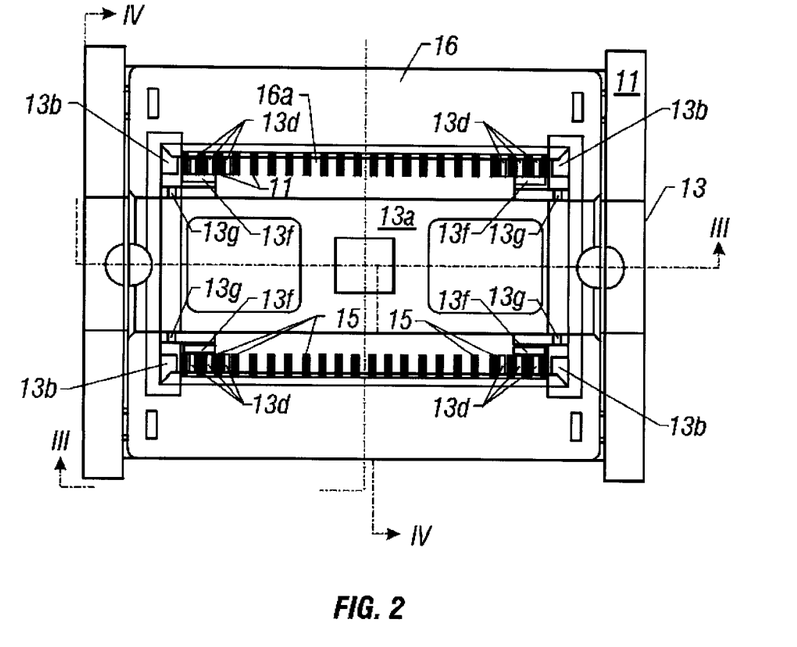
FIG. 2 is a plan view of a socket of the embodiment of FIG. 1.
Figure 3:
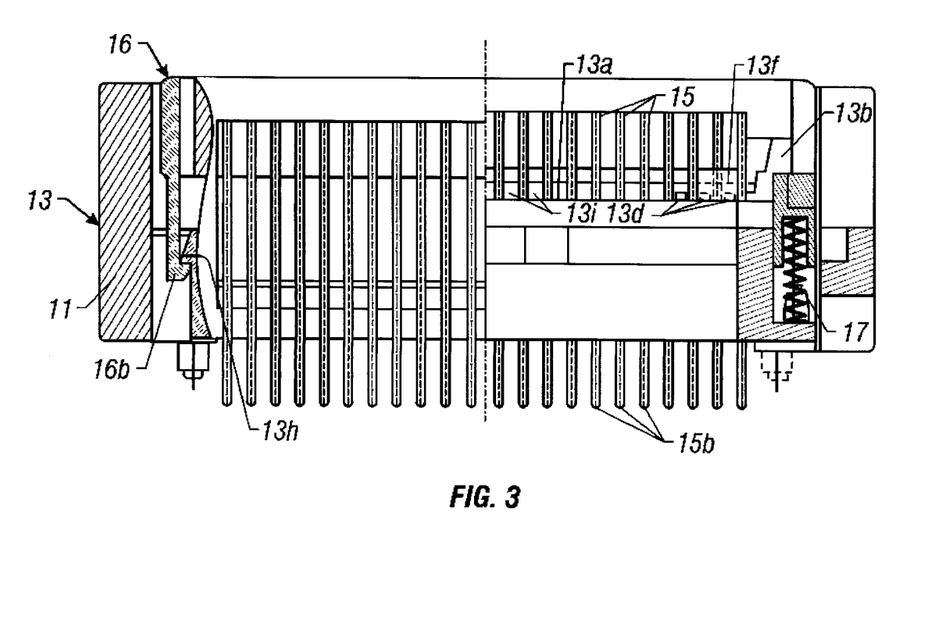
FIG. 3 is a sectional view taken along the line III—III of FIG. 2.

Furthermore, as shown in FIGS. 2 and 4, the upper operation member 16 has an opening 16a having a size capable of being inserted with the IC package 12, and the IC package 12 is mounted on the mount portion 13a of the socket body 13 by being inserted through the opening 16a. The upper operation member 16 is disposed, as shown in FIG. 3, to the socket body 13 to be vertically movable, and when the upper operation member 16 is urged upward by the spring 17 and reaches its uppermost position, a locking claw 16b is engaged with a lock portion 13h to be locked of the socket body 13 to thereby prevent the upper operation member 16 from disengaging. Still furthermore, the upper operation member 16 is formed with a cam portion 16c slidably contacting to the operation piece 15i of the contact pin 16. Then, when the upper operation member 16 is lowered, the operation piece 15i is pushed by the cam portion 16c, the spring portion 15e is elastically deformed, and the movable contact piece 15h is deformed obliquely upward at the outside portion thereof so as to be separated from the IC lead 12b. At the time of upwardly moving the operation member 16, in a manner reverse to that mentioned above, the movable contact piece 15h is deformed downward and the IC lead 12b is clamped by the movable and stationary contact pieces 15h and 15d, thereby establishing the electrically conductive state.

The IC socket 11 of the structure mentioned above will be operated in the following manner.

In the first step, the lead portions 15b of the contact pins 15 of the IC sockets 11 are inserted into the insertion holes formed to the printed wiring board and soldered thereto to arrange a plurality of IC sockets 11 on the printed wiring board.

The IC package 12 is electrically connected to such IC socket 11 by means of, for example, an automatic machine. That is, under the state that the IC package 12 is supported, the upper operation member 16 is pressed downward by the automatic machine against the urging force of the spring 17 and the contact pins 15. In this instance, the operation piece 15i is depressed by the cam portion 16c of the upper operation member 16 and the spring portion 15e is hence elastically deformed. Then, the movable contact piece 15h is displaced upward in the oblique direction to be maximally opened and retired from the insertion range of the IC package 12 as shown in FIG. 5.

Figure 7A:
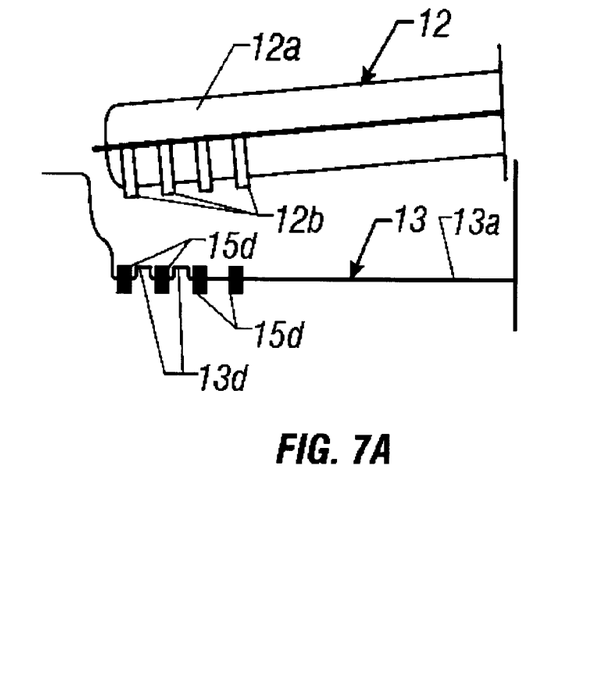
FIG. 7A is a view showing a state before the mounting of the IC package and FIG. 7B is a view showing a state of mounting the IC package.
Figure 7B:
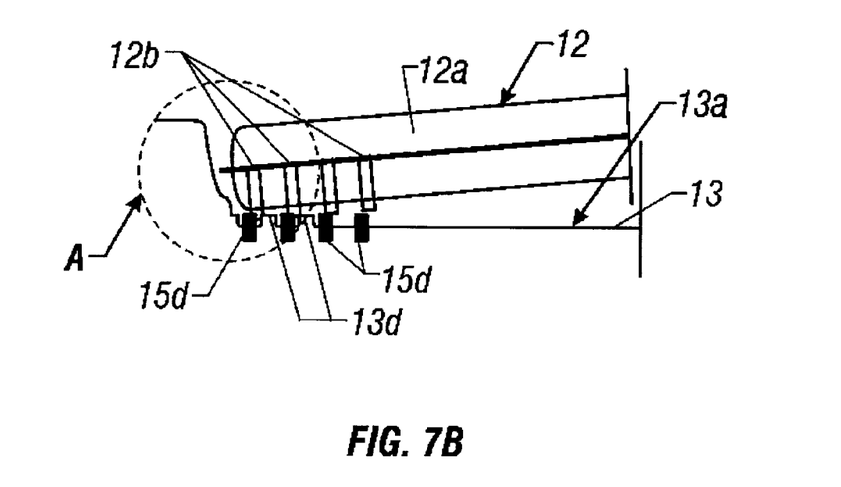

Under the state mentioned above, the IC package 12 is released from the automatic machine and is placed on the mount portion 13a of the socket body 13. In such case, it is desirable that the IC leads 12b of the IC package 12 are surely mounted on the upper surfaces 15k of the stationary contact pieces 15d of the contact pins 15. However, in the initial stage of the mounting, as shown in FIG. 7B or FIG. 1A, there was a case where the IC package 12 may be arranged slightly obliquely and the IC leads 12b are offset from the stationary contact pieces 15d. According to the present invention, however, since the projections 13d are formed to the horizontally side portions of the stationary contact pieces 15d and each of the gaps c between the projection 13d and the stationary contact piece 15d is set to be narrower than the width h of the IC lead 12b, the IC package 12 never fall out to the side portion of the stationary contact piece 15d even if the IC lead 12b be offset as mentioned above, which is a significant advantage of the present invention different far from the conventional one.

Thereafter, the position or attitude of the IC package 12 is corrected in the horizontal state and the IC package 12 is then positioned in the horizontal direction thereof by means of the guide portion 13b and the mold guide portion 13g, thus establishing the accurate contact of the IC lead 12b to the upper surface 15k of the stationary contact piece 15d.

Figure 8:
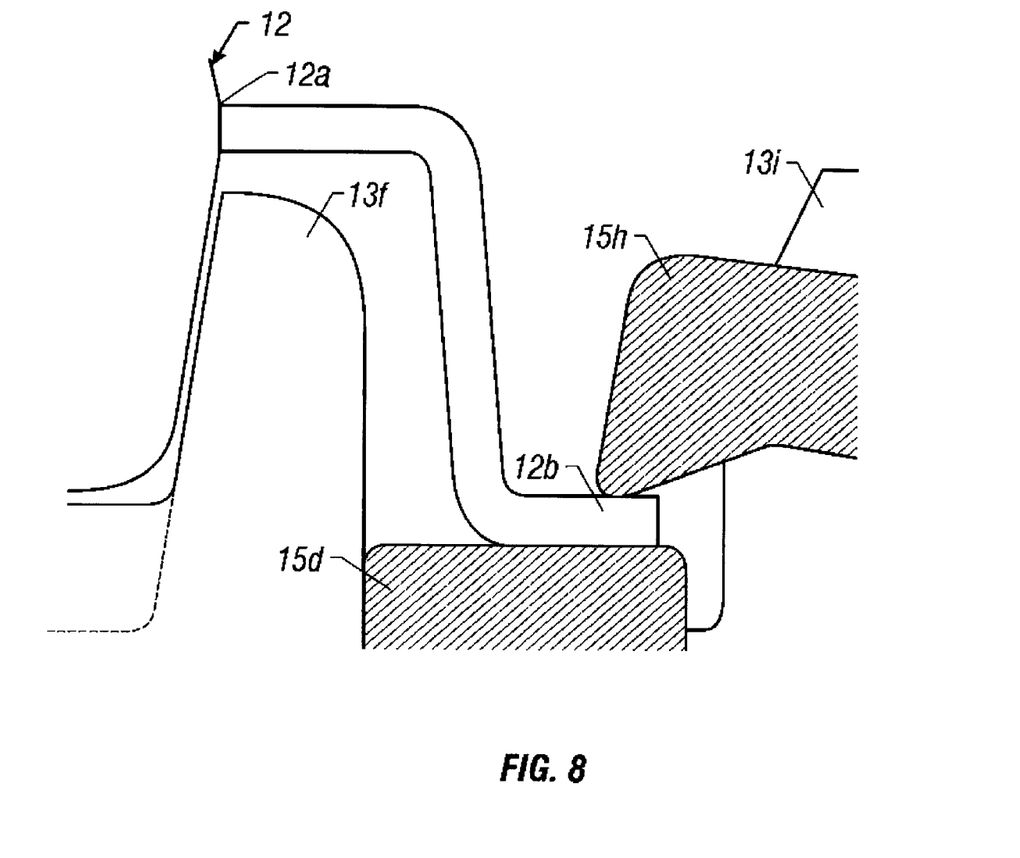
FIG. 8 is a sectional view showing a state that the IC leads are clamped between stationary and movable contact pieces.

In the next step, the pressing force of the automatic machine to the upper operation member 16 is released, the upper operation member 16 is moved upward by the urging force of the spring 17, and then, the movable contact piece 15h of the contact pin 15 starts to be returned. At a time when the upper operation member 16 is moved to the uppermost position, the movable contact piece 15h of the contact pin 15 contacts the upper surface of the predetermined IC lead 12b of the IC package 12, and the IC lead 12b is hence clamped between the stationary and movable contact pieces 15d and 15h to establish the electrical connection therebetween as shown in FIG. 8.

As mentioned hereinbefore, the upper surface 15k of the stationary contact piece 15d is positioned higher, in level, than the upper surface of the mount portion 13a by a predetermined amount, so that the dust, dirt or the like is hardly adhered to the upper surface 15k of the stationary contact piece 15d, also preventing the dirt or the like from adhering to the IC lead 12b.

Furthermore, since the formation of the projection 13d in the manner mentioned above prevents the IC lead 12b from falling out, the deformation and defective contacting state of the IC lead 12b can be also prevented.

In the described embodiment, although three projections 13d are formed near the guide portion 13b respectively, it may be possible to such projections 13d to portions between all the stationary contact pieces 15d. However, the undesired falling-out of the IC lead 12b at the setting time of the IC package 12 will be effectively prevented by forming the projections 13d at least to a portions near the guide portions 13b. That is, when the IC package 12 is set (mounted), there may cause a case where the IC package 12 is set at an oblique attitude, and in such case, the IC leads 12b positioned to both the longitudinal end portions (near the guide portion 13b) of the IC package 12 may be shifted in their correct positions and fall out of the stationary contact pieces 15d. Accordingly, in order to prevent such defect from causing, it is necessary to form the projections 13d to portions corresponding to at least the IC leads 12b which have possibility of falling out. These portions are near the guide portions 13b. When this arrangement is adopted, the entire structure of the IC socket can be made simple and the manufacturing cost can be saved in comparison with the arrangement in which the projections 13d are formed to the portions between all the stationary contact pieces 15d.

In the above disclosure of the preferred embodiment, it is to be noted that although the present invention is applied to the IC socket 11 as ìsocket for electrical partí, the present invention is not limited to the described embodiment and is applicable to other devices or apparatus. Furthermore, in the described embodiment, although the projection 13d is formed so as to provide a rectangular section, the shape thereof is not limited to the rectangular shape and may take various shapes as far as it is satisfied that the gap between the projection and the stationary contact piece has a size such that the dirt or dirt falls out through the gap but the terminal does not fall out therethrough. In this meaning, the gap may be considered as a groove having a predetermined width.

It is also to be noted that the present invention is not limited as described above to the described embodiment and many other changes and modifications may be made without departing from the scopes of the appended claims.

What is claimed is:

1. A socket for an electrical part comprising:

a socket body including a mount portion to facilitate mounting the electrical part;

a plurality of contact pins which are resiliently deformable and provided in the socket body, each configured to clamp an associated terminal of the electrical part;

an upper operation member, vertically movable, provided in the socket body and operatively connected to the contact pins, each contact pin comprising a stationary contact piece electrically engageable with a lower surface of the associated terminal and a movable contact piece deformably engageable with an upper surface of such associated terminal in a clamped position, wherein when the upper operation member is moved vertically with respect to the mount portion of the socket body, the associated movable contact piece is engagingly deformed so as to become disengaged from the clamped position, wherein in a mounted state, the upper surface of the stationary contact piece is higher in level relative to an upper surface of the mount portion of the socket body, and wherein the socket body is formed with at least one projection arranged between adjacent stationary contact pieces to thereby define a gap, the gap having a width smaller than a width of the respective terminals engageable with the adjacent stationary contact pieces to prevent either of the terminals from falling into the gap.

2. A socket for an electrical part according to claim 1, wherein said projection has an upper surface substantially equal in level to the respective upper surfaces of the adjacent stationary contact pieces.

3. A socket for an electrical part according to claim 1, wherein the socket body further includes guide portions for guiding the electrical part so as to mount the electrical part at a predetermined position on the upper surface of the mount portion, said guide portions being disposed for engagement with corner portions of the electrical part, and wherein each at least one projection includes projection elements disposed at predetermined intervals along corresponding pairs of adjacent stationary contact pieces, and wherein each guide portion is adjacent an associated pair of adjacent stationary contact pieces to guide the electrical part along a guiding direction.

4. A socket for an electrical part according to claim 3, wherein the socket body is provided with mold guide portions adapted to operate with the guide portions to cooperatively position the electrical part in the predetermined position.

5. A socket for an electrical part according to claim 1, wherein the at least one projection has a rectangular cross section.

6. A socket for an IC package comprising:

a socket body including a mount portion to facilitate mounting the IC package;

a plurality of contact pins which are resiliently deformable and provided in the socket body, each configured to clamp an associated IC lead of the IC package;

an upper operation member, vertically movable, provided in the socket body and operatively connected to the contact pins, each contact pin comprising a stationary contact piece electrically engageable with a lower surface of the associate IC lead and a movable contact piece deformably engageable with an upper surface of such associated IC lead in a clamped position, wherein when the upper operation member is moved vertically with respect to the mount portion of the socket body, the associated movable contact piece is engagingly deformed so as to become disengaged from the clamped position, wherein in a mounted state, the upper surface of the stationary contact piece is higher in level relative to an upper surface of the mount portion of the socket body, and wherein the socket body is formed with at least one projection arranged between adjacent stationary contact pieces to thereby define a gap, the gap having a width smaller than a width of the respective IC leads engageable with the adjacent stationary contact pieces to prevent either of the terminals from falling into the gap.

* * * * *